United States Patent
Lin et al.

[11] Patent Number: 5,923,989
[45] Date of Patent: Jul. 13, 1999

[54] METHOD OF FABRICATING RUGGED CAPACITOR OF HIGH DENSITY DRAMS

[75] Inventors: Shian-Jyh Lin, ChiaYi; Tsu-An Lin, TaiChung; Wen-Chieh Chang; Shiou-Yu Wang, both of Taipei; Tean-Sen Jen, ChiaYi; Hui-Jen Yang, MiaoLi; Jia-Shyong Cheng, Hsinchu; Ming-Teng Hsieh, PanChao, all of Taiwan

[73] Assignee: Nanya Technology Corporation, Tao Yuan, Taiwan

[21] Appl. No.: 09/081,598

[22] Filed: May 20, 1998

[30] Foreign Application Priority Data

Oct. 30, 1997 [TW] Taiwan .................................. 86115760

[51] Int. Cl.$^6$ .............................................. H01L 21/8242
[52] U.S. Cl. ............................................ 438/398; 438/255
[58] Field of Search ...................................... 438/253, 255, 438/396, 397, 398, 399, 486, 487, 488

[56] References Cited

U.S. PATENT DOCUMENTS 5,358,888  10/1994  Ahn et al. ................................. 438/398
5,447,878   9/1995  Park et al. ................................ 438/396
5,622,889   4/1997  Yoo et al. ................................. 438/398
5,726,085   3/1998  Crenshaw et al. ....................... 438/255

*Primary Examiner*—Olik Chaudhuri
*Assistant Examiner*—Anh D. Mai
*Attorney, Agent, or Firm*—Bacon & Thomas, PLLC

[57] ABSTRACT

A method of fabricating a rugged capacitor structure of high density Dynamic Random Access Memory (DRAM) cells is disclosed. First, MOSFETs, wordlines and bitlines are formed on a semiconductor silicon substrate. Next, a dielectric layer and a doped polysilicon layer are sequentially deposited over the entire silicon substrate. The dielectric layer and doped polysilicon layer are then partially etched to open source contact windows. Then, a polysilicon layer is deposited overlaying the doped polysilicon layer and filling into the source contact windows. Next, the polysilicon layer and doped polysilicon layers are partially etched to define bottom electrodes of the capacitors. Next, tilt angle implantation is performed to implant impurities into top surface and four sidewalls of the polysilicon layer and doped polysilicon layer. Next, a rugged polysilicon layer is deposited overlaying the polysilicon, doped polysilicon and third dielectric layers. Next, the polysilicon layer is anisotropically etched by using the rugged polysilicon layer as an etching mask to transfer rugged surface profile from the rugged polysilicon layer to the polysilicon layer. Finally, an interelectrode dielectric layer and a third polysilicon layer as top electrodes of the capacitors are sequentially formed to complete the rugged capacitor for high density DRAM applications.

33 Claims, 5 Drawing Sheets

METHOD OF FABRICATING RUGGED CAPACITOR OF HIGH DENSITY DRAMS

BACKGROUND OF THE INVENTION

(1) Field of the invention

The present invention relates to a method of fabricating the capacitors of a dynamic random access memory (DRAM) cell, and more particularly to a capacitor structure with rugged surface for high density DRAM applications.

(2) Description of the related art

A DRAM cell comprises metal-oxide-semiconductor field effect transistors (MOSFETs) and capacitors that are built in a semiconductor silicon substrate. There is an electrical contact between the source of a MOSFET and the storage node of the adjacent capacitor, forming a memory cell of the DRAM device. A large number of memory cells make up the cell arrays which combine with the peripheral circuit to produce DRAMs.

In recent years, the sizes of the MOSFETs and capacitors have become continuously smaller so that the packing densities of these DRAM devices have increased considerably. For example, a number of semiconductor manufacturing companies in the world have already begun mass production of 16 M bit or even 64 M bit DRAMs. These high density DRAMs offer the advantages of longer refresh time as well as less power consumption. However, as the sizes of the capacitors become smaller, so as the capacitance values of the capacitors are decreasing, that reduces the signal to noise ratio of the DRAM circuits, causing the performance problem. The issue of maintaining or even increasing the surface area of the storage nodes or reducing the thickness of the dielectric layer is particularly important as the density of the DRAM arrays continues to increase for future generations of memory devices.

There are two ways to deal with this problem: increasing the thickness of the bottom electrodes or increasing the surface area of the capacitors. Since increasing the thickness of the bottom electrodes is very difficult for precision lithography and etching control, increasing the capacitor surface area becomes an easier approach when the capacitor is used to fabricate 16 Mbit DRAMs and beyond. Various shapes of capacitor structures have been used to address this issue. U.S. Pat. No. 5,185,282 to Lee et al. of Hyundai Electronics (the entire disclosure of which is herein incorporated by reference) provides a method of fabricating cup-shaped capacitor storage node. Another U.S. Pat. No. 5,021,357 to Taguchi et al. of Fujisu (the entire disclosure of which is herein incorporated by reference) discloses a method of fabricating fin structure capacitor electrode. U.S. Pat. No. 5,021,357 to Choi et al. of Samsung (the entire disclosure of which is herein incorporated by reference) provides a method of fabricating cylinder-shaped capacitor structure. These capacitor structures can effectively increase the capacitance values of the capacitors, however, these processes are too complicated and highly fastidious. They are difficult to be practically employed for DRAM mass-production.

The hemispherical grained silicon (HSG-Si) is a newly developed technology, which can be used to form capacitors with larger surface area. Having the features of rugged surface area, the HSG-Si becomes more and more popular to fabricate different capacitor structures. HSG-Si deposition is described in the article entitled "A New Cylindrical Capacitor Using Hemispherical Grained Silicon (HSG-Si) for 256 Mb DRAMs" by Watanabe of NEC, IDEM 92, pp. 259–263, which is fully incorporated by reference.

SUMMARY OF THE INVENTION

According, it is a primary object of the present invention to provide a method of fabricating a rugged capacitor structure with greater capacitance per unit area.

It is another object of the present invention to provide a method of fabricating the stack capacitor structure for high density DRAM applications.

It is yet another object of the present invention to provide a method of fabricating a capacitor structure which has rugged surface on top and sidewalls of bottom electrodes to further increase the surface area of the capacitors.

It is a further object of the present invention to provide an easy and manufacturable process of capacitors that transfers the rugged surface profile to polysilicon bottom electrode by using rugged polysilicon with spherical shape as an etching mask.

These objects are accomplished by the fabrication process described below.

First, MOSFETs which include gate oxides, gate electrodes and source/drain regions are formed on a semiconductor silicon substrate. Next, a first dielectric layer deposited over the entire silicon substrate. The first dielectric layer is then partially etched to open drain contact windows. Next, bitlines are formed and defined overlaying the first dielectric layer and filling into the drain contact windows. Next, a second dielectric layer, a third dielectric layer and a doped polysilicon layer are sequentially deposited over the entire silicon substrate. The first dielectric layer, second dielectric layer, third dielectric layer and doped polysilicon layer are then partially etched to open source contact windows.

Then, a polysilicon layer is deposited overlaying the doped polysilicon layer and filling into the source contact windows. Next, the polysilicon layer and doped polysilicon layers are partially etched to define bottom electrodes of the capacitors by the conventional lithography and etching techniques. Next, tilt angle implantation is performed to implant impurities into top surface and four sidewalls of the polysilicon layer and doped polysilicon layer. Therefore, rugged bottom electrode surface is created that increases the capacitance value of the capacitors tremendously. Next, a rugged polysilicon layer with spherical shape is deposited overlaying the polysilicon, doped polysilicon and third dielectric layers. Thereafter, the silicon substrate could be placed in furnace with nitrogen flowing to activate the impurities diffusing into the rugged polysilicon layer.

Next, the polysilicon layer is anisotropically etched by using the rugged polysilicon layer as an etching mask to transfer rugged surface profile from the rugged polysilicon layer to the polysilicon layer. This step is the key point of the present invention, since only a small portion of the polysilicon layer is etched, the concave bottom electrodes with five rugged surfaces are easily transferred to the polysilicon layer. The rugged polysilicon layer grown on top of third dielectric layer can be easily removed with over-etching. Finally, an interelectrode dielectric layer and a third polysilicon layer as top electrodes of the capacitors are sequentially formed by standard integrated circuit processing procedure. The rugged capacitor for high density DRAM applications according to the present invention is accomplished.

BRIEF DESCRIPTION OF THE DRAWINGS

The accompanying drawings forming a material part of this description, in which:

FIG. 1 is a cross sectional representation of the DRAM cell after the wordlines and bitlines of the MOSFET are formed.

FIG. 2 is a cross sectional representation of the DRAM cell of FIG. 1 after the polysilicon layer is deposited.

FIG. 3 is a cross sectional representation of the DRAM cell of FIG. 2 after bottom electrodes of the capacitors are patterned.

FIG. 4 is a cross sectional representation of the DRAM cell of FIG. 3 after the rugged polysilicon layer is deposited.

FIG. 5 is a cross sectional representation of the DRAM cell of FIG. 4 after the rugged surface of the bottom electrodes is formed.

DESCRIPTION OF THE PREFERRED EMBODIMENT

Figure 1:
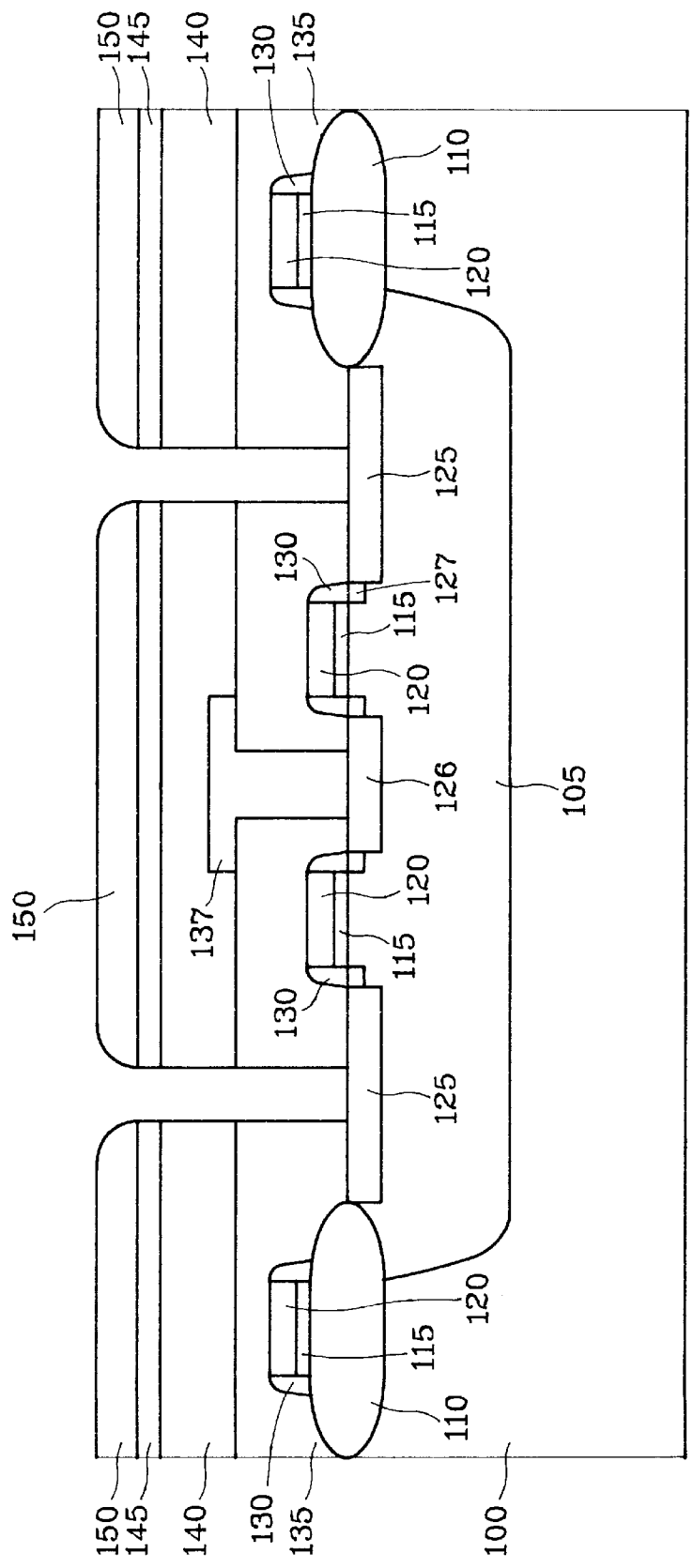
FIGS. 1 through 5 schematically illustrate the cross sectional view of a DRAM cell fabrication according to the present invention.

The invention disclosed herein is directed to a method of fabricating the rugged polysilicon capacitors of high density DRAMs. The drawing figures are illustrated a partially completed integrated circuit device. In the following description, numerous details are set forth in order to provide a thorough understanding of the present invention. It will be appreciated by ones skilled in the art that variations of these specific details are possible while still achieving the results of the present invention. In other instance, well-known processing steps are not described in detail in order not unnecessarily to obscure the present invention.

Referring now more particularly to FIG. 1, there is shown a portion of partially completed Metal-Oxide-Semiconductor Field Effect Transistor (MOSFET). The starting material of the present invention is a monocrystalline silicon substrate 100. First, a P-well 105 is formed in the silicon substrate 100. Next, filed oxide regions 110 served for isolation are formed on the surface of the silicon substrates 100 to a thickness of about 3000 to 6000 Angstroms by the conventional localized oxidation of silicon (LOCOS) or shallow trench isolation (STI) techniques.

MOSFET regions which are usually consist of gate oxides 115, gates 120, sources 125, drains 126, lightly doped drains (LDDs) 127, and spacers 130 are then formed. The gate oxide layer 115 is grown by thermal oxidation method to a thickness of about 50 to 200 Angstroms. The gate 120 of the MOSFET is usually composed of polysilicon or polycide formed by low pressure chemical vapor deposition (LPCVD) to a thickness of about 500 to 3500 Angstroms. The source 125 and drain 126 regions of the MOSFET that are formed by ion implantation technique, is preferably doped with arsenic ($As^{75}$) or phosphorus ($P^{31}$) ions. The LDD regions 127 which are located underneath both sides of the gates to lessen hot carrier effect are also formed by ion implantation technique with less implantation energy and dosage compared with source/drain regions. The spacers 130 are usually made of silicon dioxide or silicon nitride by the LPCVD technique to a thickness of about 500 to 4000 Angstroms, followed by anisotropically etching to complete the spacer formation.

Referring to FIG. 1 again, a first dielectric layer 135 is deposited over the entire silicon substrate 100. The first dielectric layer 135 is then partially etched to open drain contact windows. Next, bitlines 137 are formed overlaying the first dielectric layer and filling into the drain contact windows. Next, a second dielectric layer 140, a third dielectric layer 145 and a doped polysilicon layer 150 are sequentially deposited over the entire silicon substrate 100. The first dielectric layer 135, second dielectric layer 140, third dielectric layer 145 and doped polysilicon layer 150 are then partially etched to open source contact windows.

The first dielectric layer 135 is usually using boronphosphosilicate glass (BPSG) which is formed by atmosphere CVD (APCVD) technique under the following conditions: the temperature is about 400° C., and the pressure is about 1.0 torr, with reactant gases of $Si(C_2H_5O)_4$, $N_2$ and TMB (Tri-Methyl-Borate). The thickness of the first dielectric layer 135 is about 3000 to 10000 Angstroms. Thereafter, the first dielectric layer is planarized by thermal reflow, etchback or chemical mechanical polishing (CMP) techniques. The bitlines 137 are also composed of polysilicon or polycide as described before. The second dielectric layer 140 is still using BPSG just mentioned above. The third dielectric layer 145 is usually using non-doped silicate glass (NSG) formed by LPCVD to a thickness of about 500 to 1500 Angstroms. The doped polysilicon layer 150 is usually formed by in-situ phosphorus doped LPCVD method to obtain a polysilicon layer with lower resistance. The first dielectric layer 135, second dielectric layer 140, third dielectric layer 145 and doped polysilicon layer 150 etching process is usually using plasma etching technique such as magnetic enhanced reactive ion etching (MERIE), electron cyclotron etching (ECR) or reactive ion etching (RIE) methods.

Figure 2:
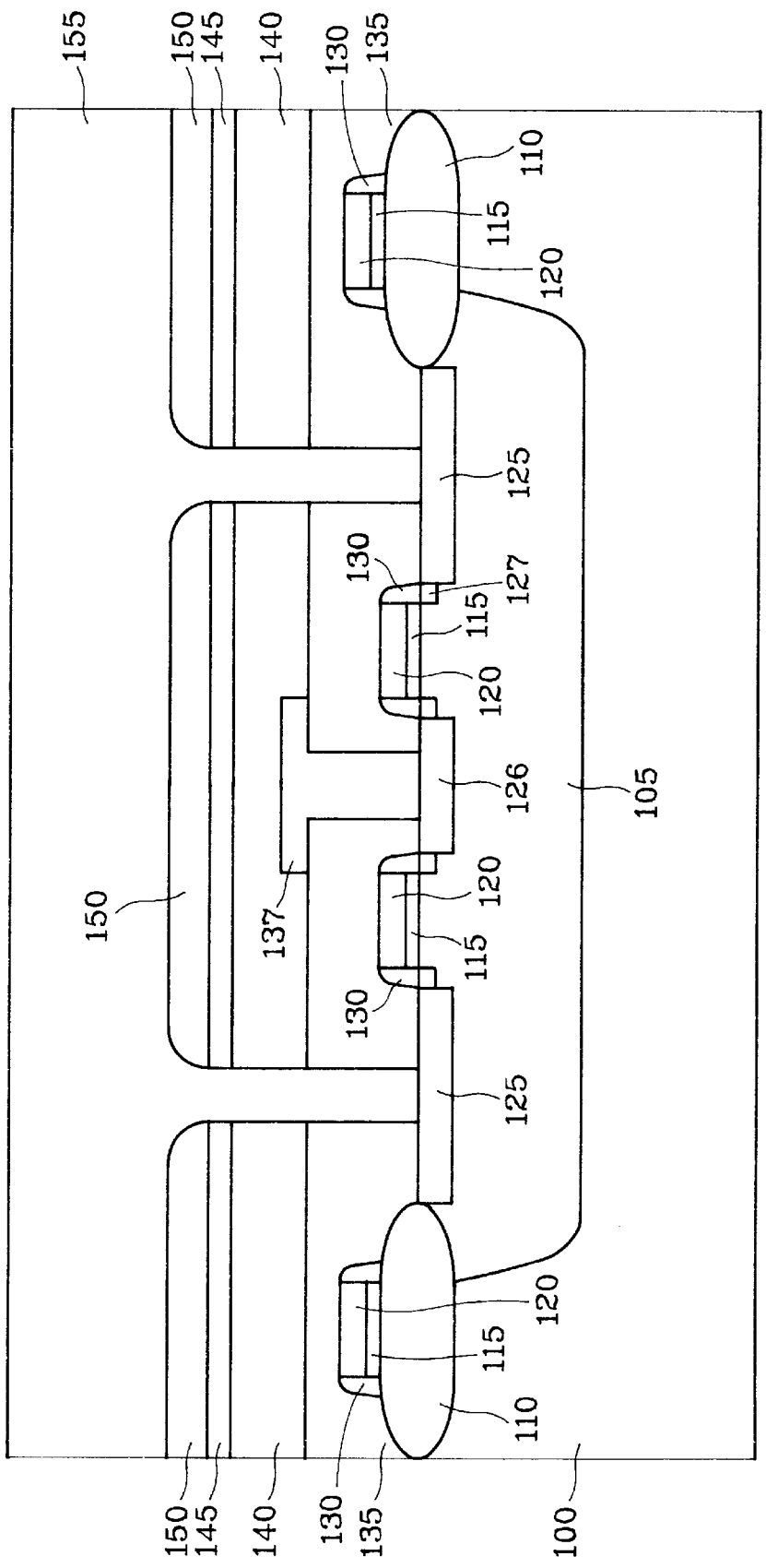
Figure 3:
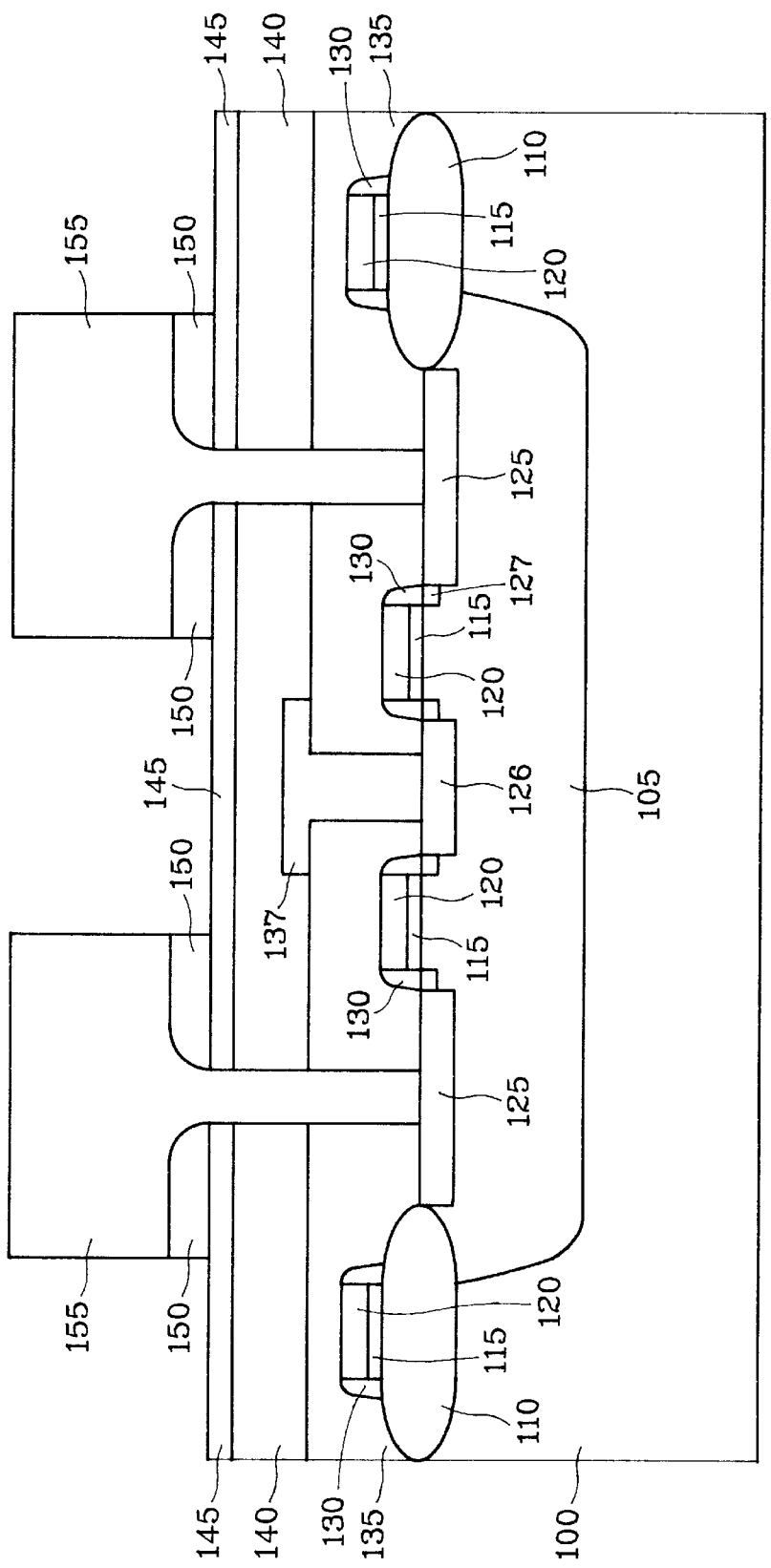

Referring now to FIGS. 2 and 3, a polysilicon layer 155 is deposited overlaying the doped polysilicon layer 150 and filling into the source contact windows as shown in FIG. 2. Next, the polysilicon layer 155 and doped polysilicon layer 150 are partially etched to define bottom electrodes of the capacitors by the conventional lithography and plasma-etching techniques as shown in FIG. 3.

The polysilicon layer 155 is usually formed by LPCVD method with silane ($SiH_4$) as reactant gas, at a temperature about 600 to 650° C. and a pressure about 0.3 to 0.6 torr to obtain a thickness of between 3000 to 20000 Angstroms. The plasma etching process is still using MERIE, ECR or RIE methods with reactant gases composed of fluoride.

Figure 4:
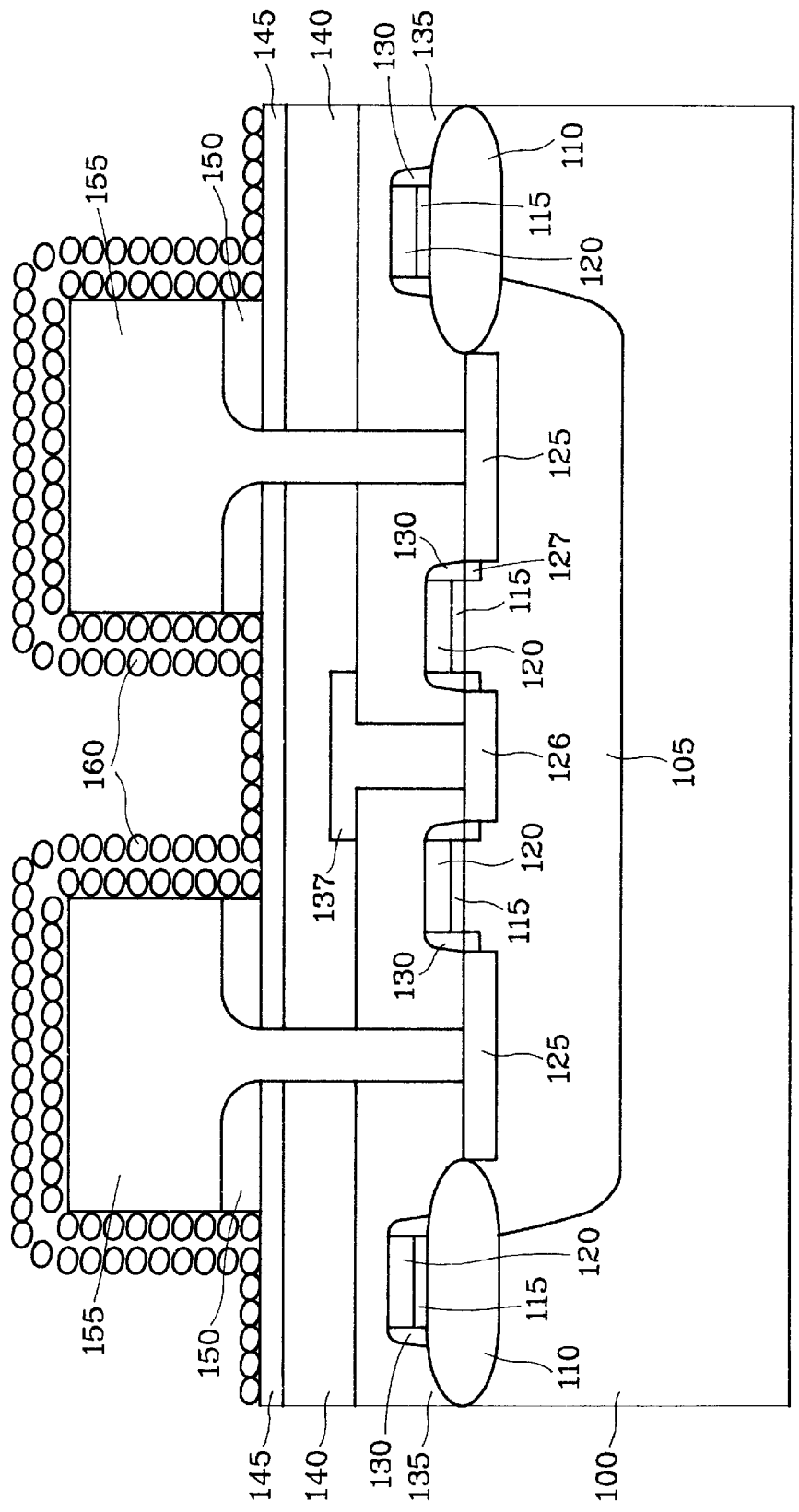

Referring now to FIG. 4, first, tilt angle implantation is performed to implant impurities into top surface and four sidewalls of both polysilicon layer 155 and doped polysilicon layer 150. This step can help the dopants implanted into bottom electrode uniformily. Alternatively, the undoped polysilicon layer 155 can be replaced with dopped polysilicon layer, this tilt angle implantation may be omitted. Next, a rugged polysilicon layer with spherical shape 160 is deposited overlaying the polysilicon layer 155, doped polysilicon 150 and third dielectric layer 145 as shown in FIG. 4. Thereafter, the silicon substrate 100 could be placed in a furnace with nitrogen flowing to activate the impurities diffusing into the rugged polysilicon layer 160.

The tilt angle implantation process is preferably doped with N type impurities such as nitrogen ($N^{13}$), phosphorus ($P^{31}$), arsenic ($As^{75}$), antimony ($Sb^{122}$), and bismuth ($Bi^{209}$) ions, with an implantation dose of 5E14 to 5E16 $cm^{-2}$, and an implantation energy of 0.05 to 100 keV. The actual angle of the tilt angle implantation process is dependent on the aspect ratio of the polysilicon layer 155 to make adjustment. The rugged polysilicon layer 160 is deposited by LPCVD method with silane ($SiH_4$) as reactant gas, at a temperature about 500 to 650° C. and a pressure range of about 0.1 to 0.3 torr or $1 \times 10^{-9}$ to $2 \times 10^{-8}$ torr to obtain a grain size of between 5 to 1500 Angstroms.

Figure 5:
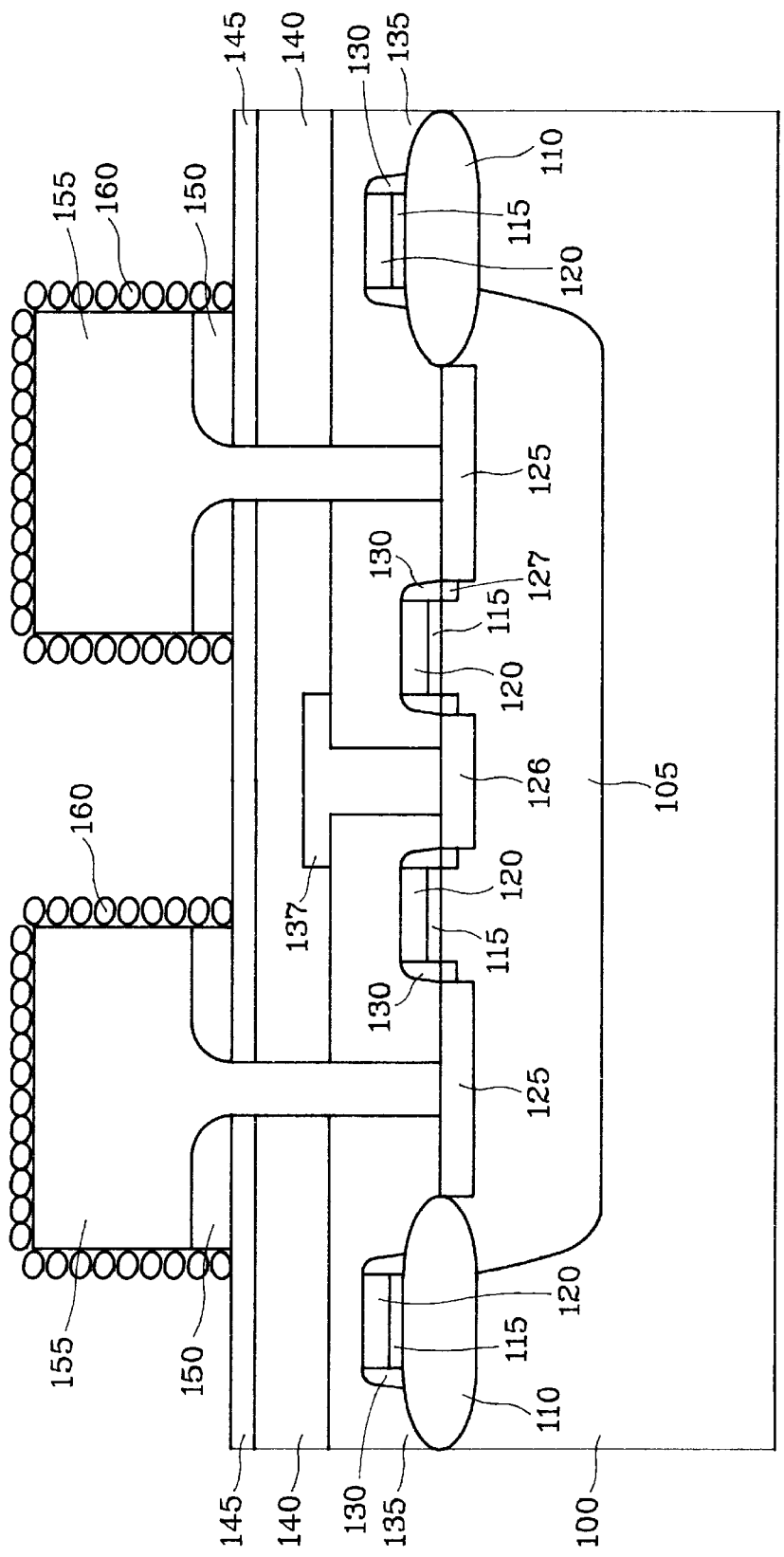

Referring now to FIG. 5, the polysilicon layer 155 is anisotropically etched by using the rugged polysilicon layer 160 as an etching mask to transfer rugged surface profile from the rugged polysilicon layer 160 to the polysilicon layer 155. Since only a small portion of the polysilicon layer 155 has been etched, the concave bottom electrodes with five rugged surfaces (top and four sides) are easily transferred to the polysilicon layer 155. Alternatively, isotropically etched may also work to directly transfer rugged surface profile from the rugged polysilicon layer 160 to the polysilicon layer 155. This step is the key point of the present invention.

Finally, an interelectrode dielectric layer and a third polysilicon layer (not shown in the figures) as top electrodes of the capacitors are sequentially formed by standard integrated circuit processing procedure. The rugged capacitor for high density DRAM applications according to the present invention is accomplished.

Alternatively, FIGS. 1 and 2 can be replaced by another preferred embodiment of the present invention. The same reference numbers represent the same elements of the previous embodiment.

Referring now to FIG. 1, after the second dielectric layer 140 is formed over the entire silicon substrate 100, the third dielectric layer 145 and doped polysilicon layer 150 deposition can be omitted. Thereafter, a polysilicon layer 155 is deposited directly overlaying the second dielectric layer 140 and filling into the source contact windows. The remaining process steps still follow the same steps of the previous embodiment as shown in FIGS. 4 and 5.

The rugged capacitor structure fabricated according to the present invention can increase the capacitance value of the capacitors tremendously. Typically, the surface area of a rugged polysilicon with spherical shape is about 2.6 times larger than that of the ordinary polysilicon. Compared with the conventional capacitor structure which only has rugged shape on top surface of the bottom electrodes, the capacitor structure of the present invention has the advantage of more rugged surface area on the sidewalls of the bottom electrodes. Therefore, the capacitor structure of the present invention further increase the surface area as well as the capacitance value of the capacitors which are more suitable for high density DRAM applications.

While the invention has been particularly shown and described with reference to a preferred embodiment, it will be understood by those skilled in the art that various changes in form and detail may be made therein without departing from the spirit and scope of the present invention.

We claim:

1. A method of fabricating capacitors of an integrated circuit on a silicon substrate, wherein said capacitor including a top electrode, a bottom electrode and an interelectrode dielectric layer, comprising the steps of:
   (a) forming a polysilicon layer on said silicon substrate, and defining said bottom electrode pattern of said capacitor;
   (b) depositing a rugged polysilicon layer over said bottom electrode surface wherein the rugged polysilicon layer is deposited having spherical shapes;
   (c) etching said polysilicon layer by using said rugged polysilicon layer as etching mask to transfer rugged surface from said rugged polysilicon layer to said polysilicon layer.

2. The method of claim 1, further comprising a step of forming a doped polysilicon layer on said silicon substrate surface prior to step (a).

3. The method of claim 1, wherein said polysilicon layer has a thickness of between 3000 to 20000 Angstroms.

4. The method of claim 2, wherein said doped polysilicon layer is formed by in-situ doped low pressure chemical vapor deposition (LPCVD).

5. The method of claim 2, wherein said polysilicon layer is doped by tilt angle implantation.

6. The method of claim 5, wherein said tilt angle implantation is implanted ions selecting from the group consisting of nitrogen ($N^{13}$), phosphorus ($P^{31}$), arsenic ($As^{75}$), antimony ($Sb^{122}$), and bismuth ($Bi^{209}$).

7. The method of claim 5, wherein said tilt angle implantation is using an energy of between 0.5 to 100 KeV.

8. The method of claim 5, wherein said tilt angle implantation is using a dose of between 5E14 to 5E16 $cm^{-2}$.

9. The method of claim 1, wherein said rugged polysilicon layer has a grain size of between 5 to 1500 Angstroms.

10. The method of claim 1, wherein said rugged polysilicon layer is formed by LPCVD.

11. The method of claim 10, wherein said rugged polysilicon layer is deposited at a temperature range of 500 to 650° C.

12. The method of claim 10, wherein said rugged polysilicon layer is deposited in a pressure range of 0.1 to 0.3 torr.

13. The method of claim 10, wherein said rugged polysilicon layer is deposited in a pressure range of $1\times10^{-9}$ to $2\times10^{-8}$ torr.

14. The method of claim 1, further comprising a step of thermally driving-in of said rugged polysilicon layer prior to step (c).

15. The method of claim 1, wherein said etching in step (c) is anisotropic etch.

16. The method of claim 1, wherein said etching in step (c) is isotropic etch.

17. A method of fabricating capacitors of an integrated circuit on a silicon substrate, wherein said silicon substrate having a plurality of pre-defined MOSFET transistors which includes gates, sources and drains, a first dielectric layer covering said MOSFET transistors, a plurality of bitlines overlaying said first dielectric layer and contacting to said drains of said MOSFET transistors via drain contact windows, and a second dielectric layer covering said first dielectric layer and bitlines, comprising the steps of:
   (a) partially etching said first dielectric and second dielectric layer to open source contact windows for said sources of said MOSFET transistors;
   (b) depositing a polysilicon layer overlaying said second dielectric layer and filling into said source contact windows, and then defining bottom electrodes of said capacitors;
   (c) depositing a rugged polysilicon layer overlaying top and four sidewalls of said bottom electrodes wherein the rugged polysilicon layer is deposited having spherical shapes; (d) etching said polysilicon layer by using said rugged polysilicon layer as etching mask to transfer rugged surface from said rugged polysilicon layer to said polysilicon layer;
   (e) forming an interelectrode dielectric layer overlaying said bottom electrodes; and
   (f) forming top electrodes overlaying said interelectrode dielectric layer.

18. The method of claim 17, wherein said integrated circuit is dynamic random access memory (DRAM).

19. The method of claim 17, further comprising a step of depositing a third dielectric layer and a doped-polysilicon layer overlaying said second dielectric layer prior to step (a).

20. The method of claim 17, wherein said polysilicon layer has a thickness of between 3000 to 20000 Angstroms.

21. The method of claim 19, wherein said doped polysilicon layer is formed by in-situ doped low pressure chemical vapor deposition (LPCVD).

22. The method of claim 17, wherein said polysilicon layer is doped by tilt angle implantation.

23. The method of claim 22, wherein said tilt angle implantation is implanted ions selecting from the group consisting of nitrogen ($N^{13}$), phosphorus ($P^{31}$), arsenic ($As^{75}$), antimony ($Sb^{122}$), and bismuth ($Bi^{209}$).

24. The method of claim 22, wherein said tilt angle implantation is using an energy of between 0.5 to 100 Kev.

25. The method of claim 22, wherein said tilt angle implantation is using a dose of between 5E14 to 5E16 $cm^{-2}$.

26. The method of claim 17, wherein said rugged polysilicon layer has a grain size of between 5 to 1500 Angstroms.

27. The method of claim 17, wherein said rugged polysilicon layer is formed by LPCVD.

28. The method of claim 27, wherein said rugged polysilicon layer is deposited at a temperature range of 500 to 650° C.

29. The method of claim 27, wherein said rugged polysilicon layer is deposited in a pressure range of 0.1 to 0.3 torr.

30. The method of claim 27, wherein said rugged polysilicon layer is deposited in a pressure range of $1 \times 10^{-9}$ to $2 \times 10^{-8}$ torr.

31. The method of claim 17, further comprising a step of thermally driving-in of said rugged polysilicon layer prior to step (d).

32. The method of claim 17, wherein said etching in step (d) is anisotropic etch.

33. The method of claim 17, wherein said etching in step (d) is isotropic etch.

* * * * *